(12) United States Patent
Kurahashi

(10) Patent No.: US 8,148,671 B2
(45) Date of Patent: Apr. 3, 2012

(54) PROXIMITY-TYPE IMAGING DEVICE AND IMAGING FILTER

(75) Inventor: Hajime Kurahashi, Sano (JP)

(73) Assignee: Fujifilm Corporation, Tokyo (JP)

( * ) Notice: Subject to any disclaimer, the term of this patent is extended or adjusted under 35 U.S.C. 154(b) by 193 days.

(21) Appl. No.: 12/719,571

(22) Filed: Mar. 8, 2010

(65) Prior Publication Data

US 2010/0264297 A1      Oct. 21, 2010

(30) Foreign Application Priority Data

Mar. 24, 2009   (JP) ................................ P2009-072312

(51) Int. Cl.
H01L 27/00   (2006.01)

(52) U.S. Cl. .................... 250/208.1; 250/216; 257/432; 257/435; 359/613

(58) Field of Classification Search ............... 250/208.1, 250/216, 214.1, 226; 257/432, 434, 435; 359/613, 622
See application file for complete search history.

(56) References Cited

U.S. PATENT DOCUMENTS 5,768,023 A * 6/1998 Sawaki et al. ................. 359/622
2009/0244711 A1 * 10/2009 Yokoyama et al. ........... 359/613

FOREIGN PATENT DOCUMENTS

JP   2005-31460 A   2/2005

* cited by examiner

Primary Examiner — Kevin Pyo
(74) Attorney, Agent, or Firm — Birch, Stewart, Kolasch & Birch, LLP

(57) ABSTRACT

A proximity-type imaging device includes an image sensor and an angle limiting filter. The image sensor performs photoelectric conversion for light transmitted from a subject using plural pixels, so as to capture the subject. The angle limiting filter includes a transparent glass substrate and a light shielding film which is formed with openings having one-to-one correspondence with the pixels and which is provided on the glass substrate. The angle limiting filter is disposed on the image sensor and limits an incidence angle of light incident to the image sensor to such an angle range that the light is incident from each opening to the corresponding pixel. The condition $$L \geq \frac{T_1}{(n_1^2 - 1)^{1/2}}$$

is satisfied, where $n_1$ denotes a refractive index of the substrate, $T_1$ denotes a thickness of the substrate, and $L$ denotes a shortest distance between a contour of one opening and a contour of the pixel corresponding to an opening adjacent.

17 Claims, 7 Drawing Sheets

PROXIMITY-TYPE IMAGING DEVICE AND IMAGING FILTER

CROSS-REFERENCE TO RELATED APPLICATIONS

This application is based upon and claims the benefit of priority from Japanese Patent Application No. 2009-72312 filed on Mar. 24, 2009; the entire contents of which are incorporated herein by reference

BACKGROUND OF THE INVENTION

1. Technical Field

The present invention relates to a proximity-type imaging device that is provided with an angle limiting filter that limits an incidence angle of light transmitted from the subject to an image sensor on a front face of the image sensor so as to be able to capture a subject, which is in proximity to the image sensor, and more particularly, relates to a proximity-type imaging device that captures a subject with the subject being in substantially close contact with an image sensor and an angle limiting filter for use therein.

2. Description of the Related Art

Image scanners that capture subjects such as an image and a document to acquire digital images have been widely used. As the image scanners, there are an image scanner in which a subject image is reduced by a reduction optical system so as to form an image on an image sensor and another image scanner that brings an image sensor to be in proximity to a subject so that the image sensor is in substantially close contact with a subject captures the subject by.

Recently, there are cases where such image scanners are built into a small-sized thin-type device such as a portable cellular phone or a notebook personal computer. Therefore, decrease in size and thickness of the image scanners has been demanded. An image scanner using the reduction optical system can reduce the size of the image sensor. However, since the image scanner uses a reduction optical system in which plural lenses are disposed along an optical axis direction, there is a limit to decrease the size and the thickness of the image scanner. On the other hand, an image scanner of the proximity-type needs an image sensor having substantially the same size as that of a subject. However, the image scanner of the proximity-type can be easily formed to be thinner than the image scanner using the reduction optical system. Accordingly, mainly the proximity-type image scanners are built into small-sized thin-type devices.

The proximity-type image scanners captures a subject with bringing the subject and the image sensor into substantially close contact with each other and establishing one-to-one correspondence between respective portions of the subject and light receiving areas, which are formed of plural pixels and are partitioned on a light receiving surface. However, the image sensor and the subject are not completely brought into close contact with each other, and there is a small gap therebetween. In the proximity-type image sensors, light transmitted from the respective portions of the subject is incident not only to the corresponding areas but also to a peripheral area thereof. Accordingly, it is difficult to acquire a fine image. Therefore, in the proximity-type image scanners, it is required to limit the incidence angle of light, which is incident to the image sensor.

As an example of limiting the incidence angle of light which is incident to the image sensor as described above, there has been known an example in which a lattice shaped light-shielding filter that shields boundaries of the light receiving areas in a compound-eye imaging device, in which lenses are arranged in a planar shape so as to correspond to the light receiving areas (JP 2005-31460 A). Also, there has been known an example in which a rod lens having a cylinder shape having a refractive index which decreases from the center thereof toward the periphery thereof is arranged or a film camera in which a porous plate having plural through holes disposed therein.

As described above, the imaging filter that is used for limiting the incidence angle of light being incident to the image sensor is formed in a lattice shape so as to substantially match with the light receiving areas. However, as the size of the light receiving areas decreases, for example, as in the case where each pixel is associated with a corresponding portion of a subject, it is difficult to provide a through hole mechanically on a substrate or to manufacture a rod lens having the same size as that of the pixel. Accordingly, recently, as fine capturing is required while an image scanner is made small and the light receiving areas are made small, an imaging filter in which a light shielding film having openings corresponding to the light receiving areas is provided on a surface of a glass substrate is used.

SUMMARY OF THE INVENTION

However, in the imaging filter in which the light shielding film having openings is provided on the glass substrate, there is light that is transmitted obliquely through the inside of the glass substrate from the opening and is incident to an adjacent light receiving area. The light, which is transmitted obliquely through the substrate, becomes a noise, which blocks acquiring of a fine image.

Also, depending on the usage environment of an image scanner such as a case where the image scanner is used without shielding light that is transmitted from the outside, light is incident from the surrounding environment of a subject. The light incident from the surrounding environment of the subject has various wavelengths and various incidence angles. Accordingly, the acquiring of a fine image may be disturbed, as described above.

The present invention has been made in view of the above circumstances, and provides a proximity-type imaging device and an imaging filter which can decrease light obliquely passing through the imaging filter and reaching pixels, accurately establish a one-to-one correspondence between respective portions of a subject and pixels, and acquire a fine image. Also, the invention may provide a proximity-type imaging device and an imaging filter which can acquire a fine image without being influenced by the surrounding environments.

According to an aspect of the invention, a proximity-type imaging device includes an image sensor and an imaging filter. The image sensor performs photoelectric conversion for light transmitted from a subject that is in proximity thereto using a plurality of pixels arranged in a predetermined arrangement, so as to capture the subject. The imaging filter includes a transparent substrate, and a light shielding film. The light shielding film is formed with openings having one-to-one correspondence with the pixels and is provided on a subject side of the substrate. The imaging filter is disposed on a front side of the image sensor and that limits an incidence angle of light incident to the image sensor to such an angle range that the light is incident from each opening to the pixel corresponding to each opening. The following condition is satisfied:

$$L \geq \frac{T_1}{\sqrt{n_1^2 - 1}}$$

where
  $n_1$ denotes a refractive index of the substrate,
  $T_1$ denotes a thickness of the substrate, and
  L denotes a shortest distance between a contour of one opening and a contour of the pixel corresponding to an opening adjacent to the one opening in an in-plane direction.

Also, the proximity-type imaging device may further include a wavelength limiting filter. The wavelength limiting filter limits a wavelength of light, which is transmitted to an image sensor side, to a predetermined wavelength range. The wavelength limiting filter decreases in transmittance of the light being in the predetermined wavelength range as the incidence angle of the light increases.

Also, the proximity-type imaging device may further include an intermediate layer. The intermediate layer has a thickness of $T_2$ and a refractive index of $n_2$. The intermediate layer is disposed between the imaging filter and the image sensor. The shortest distance L satisfies the following condition $$L \geq \frac{T_1}{\sqrt{n_1^2 - 1}} + \frac{T_2}{\sqrt{n_2^2 - 1}}.$$

Also, the openings and the pixels may be arranged in a square grid. The openings and the pixels may be formed in a square shape. The following condition may be satisfied:

$$P \geq \frac{T_1}{\sqrt{n_1^2 - 1}} + (R + r)$$

where
  R denotes a shortest distance from a center of each opening to the contour of each opening,
  r denotes a shortest distance from a center of each pixel to the contour of each pixel, and
  P denotes a pitch of the arrangement of the openings and the pixels.

Also, the openings and the pixels may be arranged in a square grid. The openings may be formed in a circle shape. The pixels may be formed in a square shape. The following condition may be satisfied:

$$P \geq \frac{T_1}{\sqrt{n_1^2 - 1}} + (R + r)$$

where
  R denotes a shortest distance from a center of each opening to the contour of each opening,
  r denotes a shortest distance from a center of each pixel to the contour of each pixel, and
  P denotes a pitch of the arrangement of the openings and the pixels.

Also, the openings and the pixels may be arranged in a square grid. The openings and the pixels may be formed in a circle shape. The following condition may be satisfied:

$$P \geq \frac{T_1}{\sqrt{n_1^2 - 1}} + (R + r)$$

where
  R denotes a shortest distance from a center of each opening to the contour of each opening,
  r denotes a shortest distance from a center of each pixel to the contour of each pixel, and
  P denotes a pitch of the arrangement of the openings and the pixels.

Also, the openings and the pixels may be arranged in a honeycomb shape in which positions of the openings and the pixels are alternately shifted every row or every column so that the openings and the pixels are located at vertexes of regular triangles. The openings and the pixels may be formed in a square shape. The following condition may be satisfied:

$$P \geq \frac{1}{2}(\sqrt{3} + 1) \cdot (R + r) + \frac{1}{2}\sqrt{2(\sqrt{3} - 2) \cdot (R + r)^2 + \frac{4T_1^2}{n_1^2 - 1}}$$

where
  R denotes a shortest distance from a center of each opening to the contour of each opening,
  r denotes a shortest distance from a center of each pixel to the contour of each pixel, and
  P denotes a pitch of the arrangement of the openings and the pixels.

Also, the openings and the pixels may be arranged in a honeycomb shape in which positions of the openings and the pixels are alternately shifted every row or every column so that the openings and the pixels are located at vertexes of regular triangles. The openings may be formed in a circle shape. The pixels may be formed in a square shape. The following condition may be satisfied:

$$P \geq \frac{1}{2}(\sqrt{3} + 1) \cdot r + \frac{1}{2}\sqrt{2(\sqrt{3} - 2) \cdot r^2 + 4\left(\frac{T_1}{\sqrt{n_1^2 - 1}} + R\right)^2}$$

where
  R denotes a shortest distance from a center of each opening to the contour of each opening,
  r denotes a shortest distance from a center of each pixel to the contour of each pixel, and
  P denotes a pitch of the arrangement of the openings and the pixels.

Also, the openings and the pixels may be arranged in a honeycomb shape in which positions of the openings and the pixels are alternately shifted every row or every column so that the openings and the pixels are located at vertexes of regular triangles. The openings and the pixels may be formed in a circle shape. The following condition may be satisfied:

$$P \geq \frac{T_1}{\sqrt{n_1^2 - 1}} + (R + r)$$

where
  R denotes a shortest distance from a center of each opening to the contour of each opening, r denotes a shortest distance from a center of each pixel to the contour of each pixel, and P denotes a pitch of the arrangement of the openings and the pixels.

According to another aspect of the invention, an imaging filter that is disposed on a front side of an image sensor which performs photoelectric conversion for light transmitted from a subject that is in proximity thereto using a plurality of pixels arranged in a predetermined arrangement, so as to capture the subject, includes a transparent substrate; and a light shielding film. The light shielding film is formed with openings having one-to-one correspondence with the pixels and that is provided on a subject side of the substrate. The following condition is satisfied $$L \geq \frac{T_1}{\sqrt{n_1^2 - 1}}$$

where $n_1$ denotes a refractive index of the substrate, $T_1$ denotes a thickness of the substrate, and L denotes a shortest distance between a contour of one opening and a contour of the pixel corresponding to an opening adjacent to the one opening in an in-plane direction.

An incidence angle of light incident to the image sensor is limited to such an angle range that the light is incident from each opening to the pixel corresponding to each opening.

With the above configuration, there are provided a proximity-type imaging device and an imaging filter which can decrease light obliquely passing through the imaging filter and reaching pixels, accurately establish a one-to-one correspondence between respective portions of a subject and pixels, and acquire a fine image. Also, the proximity-type imaging device and the imaging filter can acquire a fine image without being influenced by the surrounding environments.

DETAILED DESCRIPTION OF EMBODIMENTS OF THE INVENTION

Figure 1:
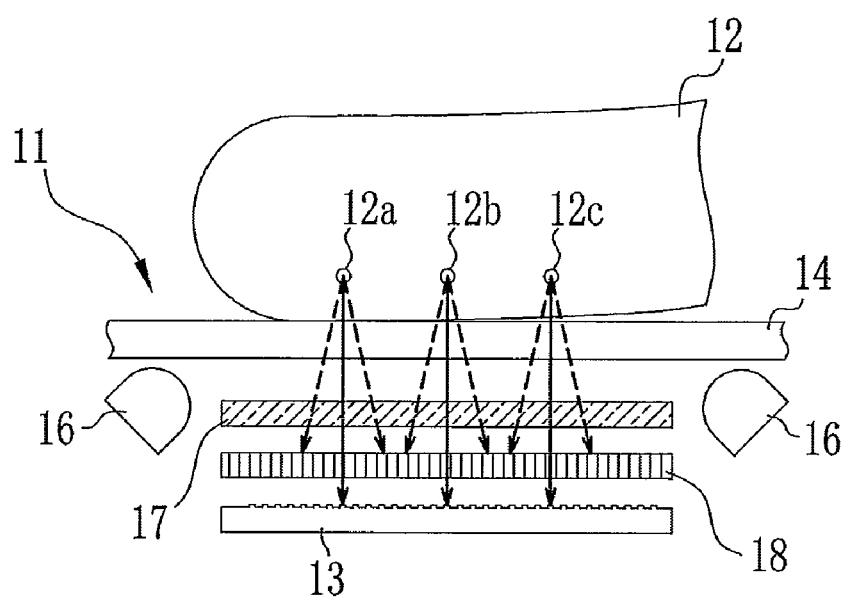
FIG. 1 is an explanatory diagram showing the configuration of a proximity-type imaging device.

As shown in FIG. 1, a proximity-type imaging device 11 is a proximity-type image scanner that captures a surface (or an internal structure of a surface layer) of a subject 12 by capturing the subject 12 with the subject 12 being in substantially close contact with an image sensor 13. The proximity-type imaging device 11 includes the image sensor 13, a cover glass 14, an LED 16, a high pass filter (not shown), a low pass filter 17, an angle limiting filter 18, and the like.

The image sensor 13 is, for example, a CMOS-type area image sensor in which pixels having sensitivity to an infrared wavelength range are two-dimensionally arranged in a square imaging area. The image sensor 13 is disposed to be brought into substantially close contact with the vicinity of the cover glass 14. Also, various thin optical filters such as the low pass filter 17, the angle limiting filter 18, and the high pass filter are disposed on a front side (the subject 12 side) of the image sensor 13. The pixels of the image sensor 13 are formed in a square shape and are arranged in a square grid at predetermined pitches (at predetermined intervals). For convenience of description, FIG. 1 shows that the image sensor 13 and various optical filters are separated from one another. However, the image sensor 13 and various optical filters are substantially integrally formed so that they are in close contact with each other through an adhesive agent, air, or the like.

The cover glass 14 is a transparent glass plate and protects the image sensor 13, the low pass filter 17, the angle limiting filter 18, and the like, which are disposed on a lower side thereof, from damage or dust. Also, the subject 12 is disposed to be in substantially close contact with the cover glass 14.

The LED 16 is a light source that emits infrared light which is in a predetermined wavelength range and which is centered at a wavelength of $\lambda_0$ (=850 nm). The LED 16 illuminates the subject 12 when the subject 12 is captured by the proximity-type imaging device 11. The plural LEDs 16 are disposed near the image sensor 13 toward the subject 12 side and illuminate the subject 12 uniformly. Accordingly, the image sensor 13 captures the subject 12 using the infrared light, which is in the predetermined wavelength range and which is centered at the wavelength $\lambda_0$ of light emitted from the LEDs 16.

The high pass filter reflects light, such as visible light or ultraviolet light, having a wavelength shorter than the infrared light having a wavelength near $\lambda_0$ which is used for an imaging process, and transmits the infrared light having the wavelengths near $\lambda_0$ and light having a wavelength longer than $\lambda_0$. The high pass filter is disposed on the subject 12 side of the low pass filter 17. Accordingly, although light of various wavelength ranges is incident to the proximity-type imaging device 11 from the subject 12 side, the wavelength range of the light incident to the low pass filter 17 is limited by the high pass filter to infrared light having a wavelength near $\lambda_0$ and light having a wavelength longer than $\lambda_0$.

The low pass filter 17 and the angle limiting filter 18 are disposed on the front side of the image sensor 13 and limit the wavelength range and the incidence angle of light which is incident to the image sensor 13 from the subject 12. In particular, the low pass filter 17 and the angle limiting filter 18 limit the wavelength range of the light incident to the image sensor 13 from the subject 12 to the wavelength range of the infrared light near $\lambda_0$, and limits the incidence angle of light incident to the image sensor 13 so as to be substantially perpendicular to the image sensor 13. Accordingly, the proximity-type imaging device 11 captures the subject 12 so that respective portions 12a to 12c of the subject 12 have one-to-one correspondence with the pixels of the image sensor 13. Also, the low pass filter 17 is disposed between the high pass filter and the angle limiting filter 18, and the angle limiting filter 18 is disposed between the low pass filter 17 and the image sensor 13.

Figure 2A:
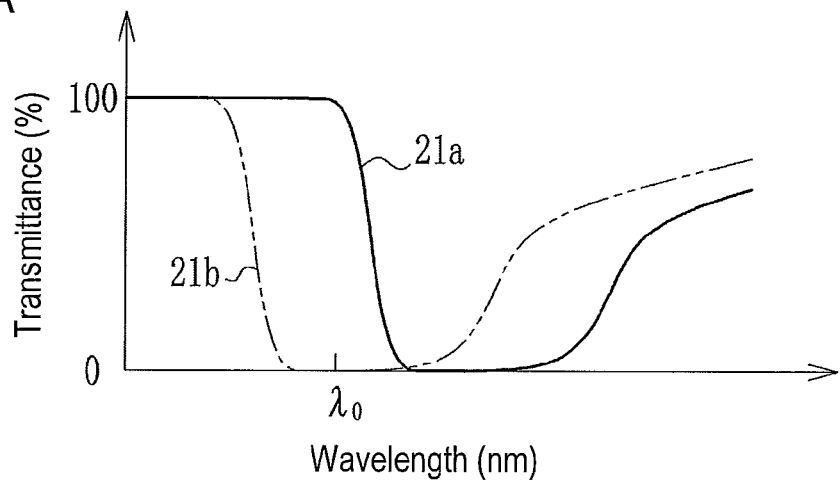
FIGS. 2A to 2C are graphs showing transmission characteristics of a low pass filter.

As shown in FIG. 2A, the low pass filter 17 is a low pass filter that limits the wavelength range of light to be transmitted from the subject 12 to the image sensor 13 side by transmitting light of a shorter wavelength side and reflecting light of a longer wavelength side with the wavelength range near the wavelength of $\lambda_0$ being used as a boundary. The low pass filter 17 is formed by stacking plural dielectric thin films on a transparent glass substrate. The transmission characteristics of the low pass filter 17, as denoted by a graph 21a (solid line), are configured such that the transmittance sharply changes in a narrow wavelength range near the wavelength of $\lambda_0$ in the case where the incidence angle is about 0 degree. Also, the transmittance characteristics of the low pass filter 17 change in accordance with the incidence angle of light incident to the low pass filter 17. With reference to a graph of transmittance with respect to the wavelength, as shown in a graph 21b (dashed-two dotted line), the transmittance characteristics of the low pass filter 17 are shifted to the shorter wavelength side as a whole in accordance with an incidence angle in the case where light is incident in a tilted state.

Figure 2B:
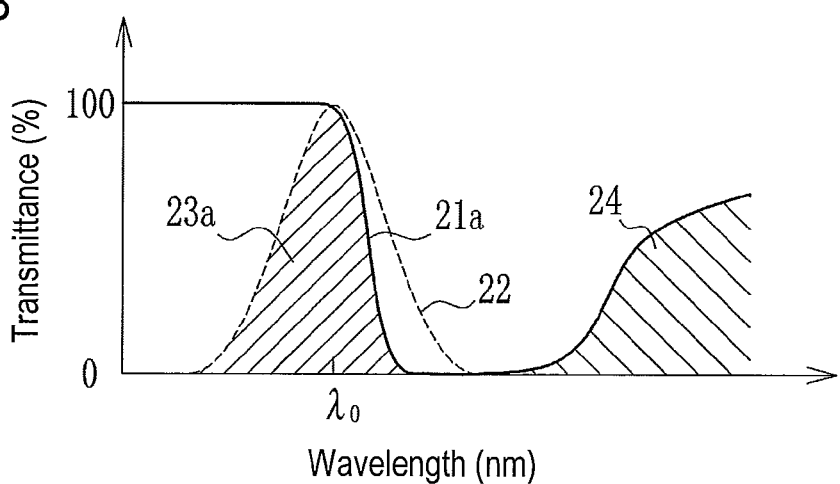
Figure 2C:
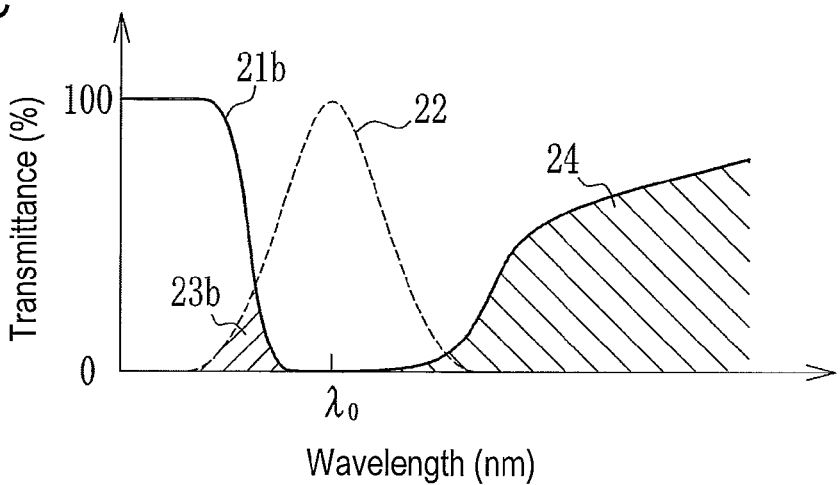

While infrared light having a wavelength near $\lambda_0$ are incident to the low pass filter 17 with various incidence angles, an amount of transmitted light of the infrared light which is vertically incident is in proportion to an area of a shaded portion 23a that is surrounded by the graph 21a and the spectrum 22 of the LED 16 as shown in FIG. 2B. Also, as shown in FIG. 2C, an amount of transmitted light of the infrared light incident to be tilted is in proportion to a shaded portion 23b which is surrounded by the graph 21b and the spectrum 22 and is smaller than the shaded portion 23a. Accordingly, the transmittance of the infrared light having a wavelength near $\lambda_0$, which can be transmitted through the low pass filter 17 in the case where the infrared light are vertically incident, decreases depending on the incidence angle in the case where the infrared light are incident to the low pass filter 17 in a tilted state. As a result, the transmittance of the low pass filter 17 changes in accordance with the incidence angle. Thereby, the low pass filter 17 limits the incidence angle of the light incident to the image sensor 13 to a substantially vertical range.

Also, since the low pass filter 17 is configured of a limited number of the dielectric thin films, there is a portion 24, in which the transmittance is not 0%, in a long-wavelength range sufficiently far apart from the wavelength of $\lambda_0$. The graph 21a of the transmittance with respect to the wavelength, as described above, is shifted to the short-wavelength side in accordance with the incidence angle. However, when the incidence angle is large, there may be a case where a spectrum 22 of the LED 16 and the portion 24 overlap each other. At the incidence angle at which the portion 24 and the spectrum 22 overlap each other, as described above, the infrared light whose amount is in proportion to the area surrounded by the portion 24 and the spectrum 22 is transmitted through the low pass filter 17. Thus, the amount of transmitted light through the low pass filter 17 gradually decreases as the incidence angle increases within a predetermined angle range, and the amount of transmitted light becomes substantially zero in a portion where the incidence angle is large. However, when the incidence angle increases further, the infrared light whose amount corresponds to an overlap between the portion 24 and the spectrum 22 is transmitted through the low pass filter 17.

Figure 3:
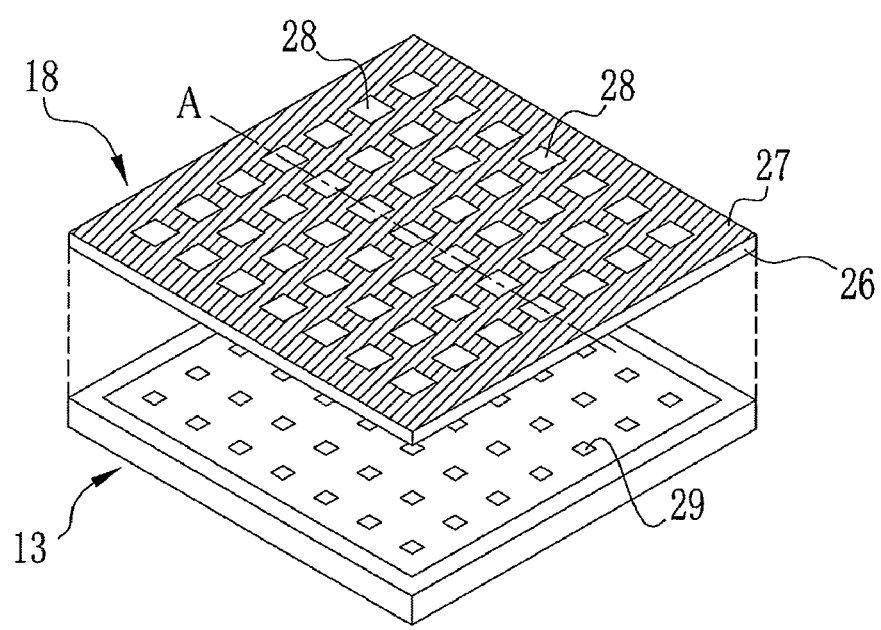
FIG. 3 is an explanatory diagram showing the configuration of an angle limiting filter.

As shown in FIG. 3, the angle limiting filter 18 includes a thin transparent glass substrate 26 having a thickness of about 0.15 mm and a light shielding film 27 disposed on a surface of the glass substrate 26. The light shielding film 27 is disposed on the subject 12 side of the glass substrate 26 and is formed by stacking plural dielectric thin films. The light shielding film 27 is an absorption film that absorbs incident light. The light shielding film 27 absorbs light of all the wavelength ranges, to which the pixels of the image sensor 13 have sensitivity, including the wavelength range near the wavelength of $\lambda_0$. In the light shielding film 27, plural openings 28 is formed. The openings 28 are disposed in a square grid in accordance with the square grid of the pixels 29 of the image sensor 13 so as to form one-to-one correspondence with the pixels 29. Thus, the pitches (intervals) of the openings 28 are the same as those of the pixels 29. Each opening 28 is formed in a square shape.

Figure 4A:
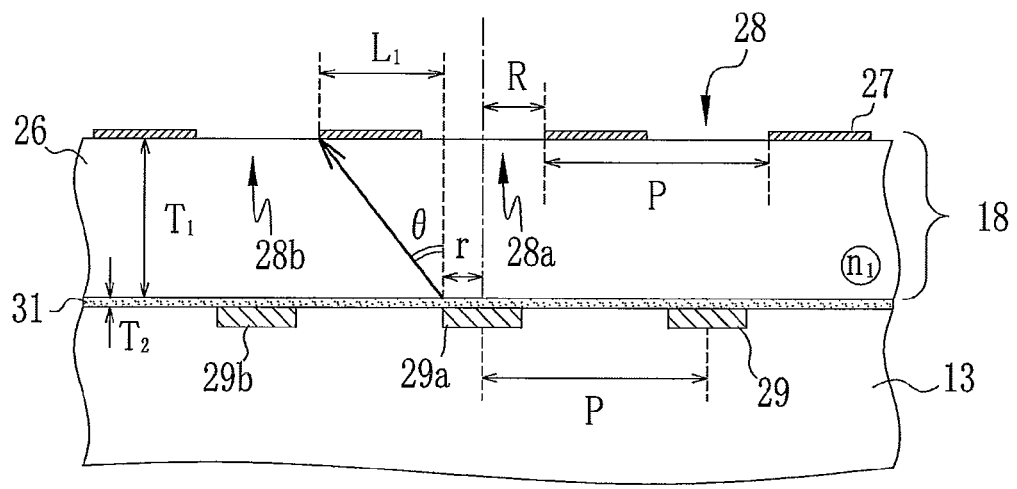
FIGS. 4A and 4B are section views showing the configuration of an angle limiting filter.

As shown in FIG. 4A, when the cross section of the proximity-type imaging device 11 is viewed along the row (line A shown FIG. 3) of the openings 28, the angle limiting filter 18 is disposed to match the center positions of the pixels 29 and the center positions of the openings 28, so that the openings 28 and the pixels 29 have one-to-one correspondence with each other and the openings 28 are located right above the pixels 29. Thus, for example, an opening 28a located right above a certain pixel 29a corresponds to the certain pixel 29a. Also, an opening 28b adjacent to the opening 28a is disposed so as to correspondence to a pixel 29b adjacent to the specific pixel 29a.

Also, the size of the opening 28 is larger than that of the pixel 29. Here, it is assumed that the length of the side of the opening 28 is 2R, that the length of the side of the pixel 29 is 2r, and that a distance (a shortest length from the center to the contour) R from the center of the opening 28 to the center of the side is longer than a distance (a shortest distance from the center to the contour) r from the center of the pixel 29 to the center of the side (R>r).

The angle limiting filter 18 is disposed to be in substantially close contact with the front side of the image sensor 13 through an intermediate layer 31. The intermediate layer 31, for example, is a bonding layer that bonds the angle limiting filter 18 to the image sensor 13. Here, a thickness $T_2$ of the intermediate layer 31 is set to be sufficiently smaller than a thickness $T_1$ of the glass substrate 26 ($T_2/T_1 \ll 1$). Although the low pass filter 17 is disposed on the top surface side (the subject 12 side) of the angle limiting filter 18, the low pass filter 17 and the angle limiting filter 18 are not bonded to each other, and the top surface of the angle limiting filter 18 is located to be adjacent to a thin air layer (refractive index n≈1).

The angle limiting filter 18 is disposed as described above and is configured so as to satisfy a condition which will be described below. Firstly, it is assumed that $L_1$ denotes a shortest distance between the contour of the certain pixel 29a and the contour of the opening 28b (hereinafter, referred to as a "neighbor opening") corresponding to the adjacent pixel 29b in the in-plane direction, and that θ denotes a minimum angle between (i) a direction along which the contour of the neighbor opening 28b is viewed from the contour of the pixel 29a and (ii) the normal line. In this case, the shortest distance $L_1$ can be represented by "$L_1 = T_1 \tan \theta$". Here, it is assumed that $\theta_m$ denotes a critical angle for the case where light is incident from the glass substrate 26 side to the top surface (the subject 12 side) of the angle limiting filter 18. In this case, the angle limiting filter 18 is configured to satisfy the following conditional expression (1), so that the angle θ is equal to or greater than the critical angle $\theta_m$ ($\theta \geq \theta_m$). The critical angle $\theta_m$ satisfies the condition of "$\sin \theta_m = 1/n_1$". Thus, when the right side of the conditional expression (1) is transformed using this condition, the conditional expression that is to be satisfied by the shortest distance $L_1$ becomes a conditional expression (2) represented below.

$$L_1 \geq T_1 \cdot \tan\theta_m \quad (1)$$

$$L_1 \geq \frac{T_1}{\sqrt{n_1^2 - 1}} \quad (2)$$

Figure 4B:
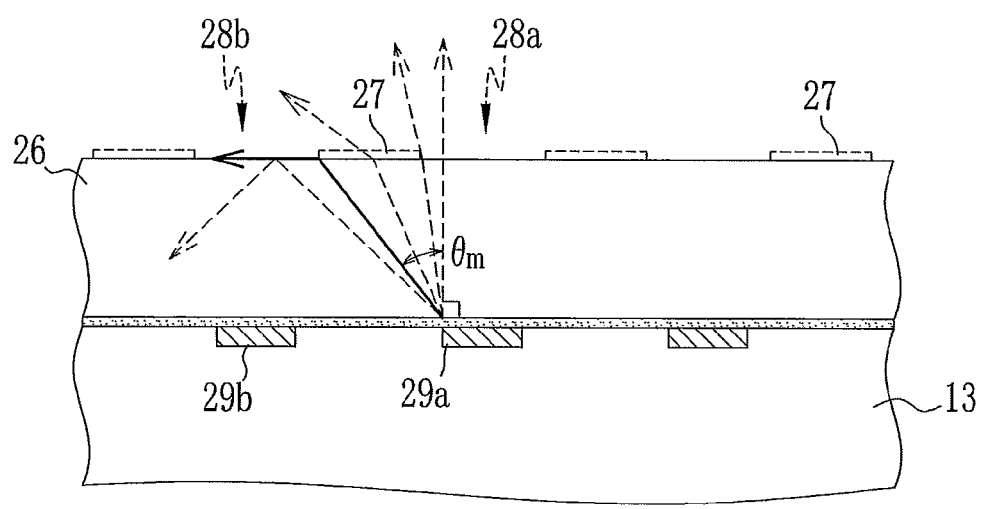

The conditional expression (2) (conditional expression (1)) is a condition under which light is totally reflected by the neighbor opening 28b in the case where the light is emitted at various angles from the certain pixel 29a toward the subject 12 side surface of the angle limiting filter 18. Also, as shown in FIG. 4B, the equal sign shown in the conditional expression (2) (conditional expression (1)) represents the case where the angle θ between the direction along which a closest position of the contour of the neighbor opening 28b is viewed from the contour of a pixel 29a and the normal line is exactly the same as the critical angle $\theta_m$. Thus, when the openings 28 (and the pixels 29) are provided so as to satisfy the conditional expression (2), the angle limiting filter 18 blocks light from being incident to each pixel 29 through a corresponding neighbor opening 28 by using the light shielding film 27 and limits the incidence angle of light from the subject 12 to the image sensor 13 so that only light, which substantially vertically passes through the opening 28 located right above each pixel 29, is incident into each pixel 29.

Also, a specific value of the shortest distance $L_1$ may be arbitrarily set so long as the conditional expression (2) is satisfied and the configuration of the above-described angle limiting filter 18 is maintained. Accordingly, when $L_{min}$ denotes the lower limit of the conditional expression (1) and P denotes the pitch (interval) of the openings 28 and the pixels 29, the shortest distance $L_1$ can be set in a range in which the condition of "$P > L_1 \geq L_{min}$" is satisfied. When the shortest distance $L_1$ has a value equal to or greater than the pitch P of the openings 28 and the pixels 29, the size of the opening 28 or the size of the pixel 29 becomes zero, and the proximity-type imaging device 11 cannot be configured as described above. The upper limit value of the shortest distance applies in the same manner to modified examples which will be described later.

In the proximity-type imaging device 11, the openings 28 and the pixels 29 are arranged in a square grid, and each of the openings 28 and the pixels 29 is formed in a square shape. Accordingly, the image sensor 13 and the angle limiting filter 18 are formed so that the pitch (interval) P of the arrangements of the openings 28 and the pixels 29 satisfies a conditional expression (3) represented below.

$$P \geq \frac{T_1}{\sqrt{n_1^2 - 1}} + (R + r) \quad (3)$$

The conditional expression (3) can be derived from the conditional expression (2) (conditional expression (1)) under a condition that the openings 28 and the pixels 29 are arranged in the square grid and each of the openings 28 and the pixels 29 is formed in the square shape. Firstly, when the openings 28 and the pixels 29 are arranged in the square grid, and each of the openings 28 and the pixels 29 is formed in the square shape, the shortest distance $L_1$ satisfies the condition of "$L_1 = P - (R+r)$". Then, when the conditional expression (2) is transformed with respect to the pitch P by using this condition, the conditional expression (3) is obtained.

The pitch P of the openings 28 and the pixels 29 can be arbitrarily set so long as the conditional expression (3) is satisfied and the image sensor 13 does not lose the resolving power. Accordingly, when $P_{min}$ denotes the lower limit of the conditional expression (3), and W denotes a width (or length) of the imaging area of the image sensor 13 in which the pixels 29 are arranged, the pitch P can be set in a range where a condition of "$W/2 > P \geq P_{min}$" is satisfied. When the pitch P of the openings 28 and the pixels 29 exceeds a half of the width W of the imaging area, two or more pixels 29 cannot be arranged within the imaging area. As a result, the image sensor 13 substantially loses the resolving power. Also, the upper limit of the pitch P applies in the same manner to the modified examples which will be described later.

As described below, the proximity-type imaging device 11 which is configured as described above captures the subject 12 while limiting the wavelength of light incident to each pixel 29 to infrared light having a wavelength near $\lambda_0$ and establishing one-to-one correspondence between respective portions of the subject 12 and the pixels 29.

Figure 5:
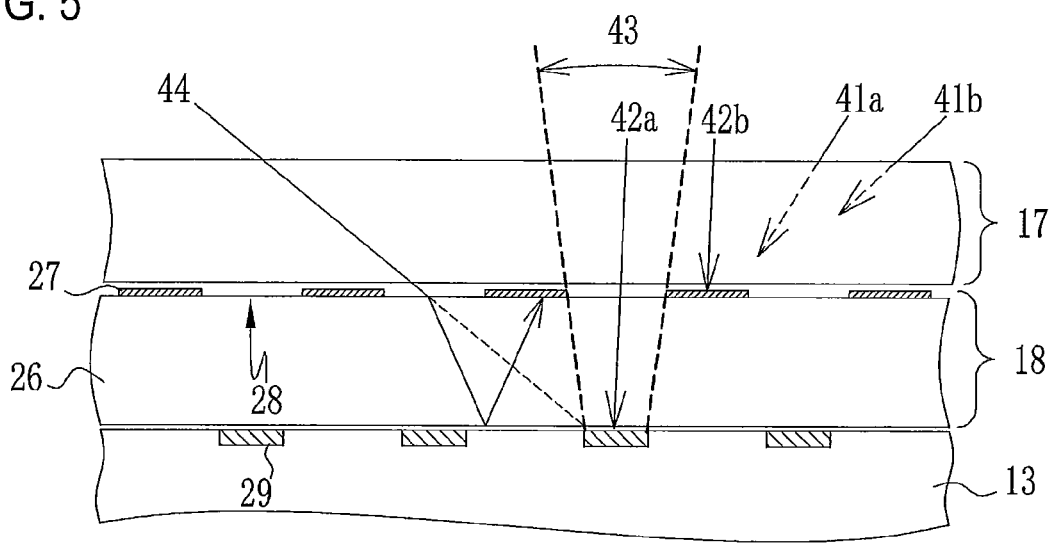
FIG. 5 is an explanatory diagram showing an operation of the proximity-type imaging device.

As shown in FIG. 5, the proximity-type imaging device 11 performs an imaging process by emitting infrared light having wavelengths near $\lambda_0$ from the LEDs 16 to the subject 12. Therefore, infrared light 41a, 41b, 42a, and 42b having wavelengths near the wavelength of $\lambda_0$ scattered from the surface or the surface layer structure of the subject 12 are incident to the proximity-type imaging device 11. As described above, the infrared light 41a, 41b, 42a, and 42b incident from the subject 12 are transmitted through the high pass filter and are incident to the low pass filter 17. The infrared light 41a, 41b, 42a, and 42b reaching the low pass filter 17 are incident to the low pass filter 17 with various incidence angles.

Of the infrared light 41a, 41b, 42a, and 42b incident to the low pass filter 17, tilted light 41a and 41b, which are incident in a tilted state, have their intensities decreased by the low pass filter 17 in accordance with the incidence angles, and hardly reach the angle limiting filter 18. On the other hand, of the infrared light 41a, 41b, 42a, and 42b incident to the low pass filter 17, the vertical light 42a and 42b which are vertically incident are transmitted through the low pass filter 17 with high transmittance close to 100% and reach the angle limiting filter 18.

Then, of the vertical light 42a and 42b, which are transmitted through the low pass filter 17, the vertical light 42b incident to the light shielding film 27 is absorbed and does not reach the image sensor 13. Thus, only the vertical light 42a incident to the opening 28 passes through the opening 28 and is incident to a pixel 29 which is located right below the opening 28 and corresponds to the opening 28 through which the vertical light 42a passes.

Also, like the infrared light 44, when infrared light has an incidence angle greater than those of the infrared light 41a and 41b, there are cases where the infrared light may be transmitted through the low pass filter 17 with its intensity decreased and reaches the angle limiting filter 18 due to the transmittance characteristics of the low pass filter 17 for a long-wavelength range that is sufficiently apart from the wavelength of $\lambda_0$. Thus, when the infrared light which is incident to the angle limiting filter 18 in a tilted state is incident to the light shielding film 27, it is absorbed and does not enter the inside of the angle limiting filter 18. On the other hand, when the above-described infrared light is incident to the opening 28, the infrared light enters the inside of the angle limiting filter 18.

However, the proximity-type imaging device 11, as described above, is configured so as to satisfy the conditional expression (2) (conditional expression (1)). Therefore, when infrared light is incident to the opening 28 at any angle, there is no case where the infrared light incident to the angle limiting filter 18 reaches any pixel 29 (a neighbor pixel 29 or a pixel 29 located farther) other than a pixel 29 corresponding to the opening 28 through which the infrared light passes. For example, when infrared light incident to the opening 28 in a tilted state, like the infrared light 44, enters the inside of the angle limiting filter 18, the infrared light reaches a position between (i) the pixel 29 located right below the passed opening 28 and (ii) the neighbor pixel 29, and is not incident to the neighbor pixel 29. Then, the infrared light reached the position between the pixel 29 and the neighbor pixel 29 is reflected by the bottom face of the angle limiting filter 18, the surface of the image sensor 13, or the like and is incident to the light shielding film 27 and absorbed, like the infrared light 44.

Accordingly, only infrared light such as the vertical light 42a, which passes through the opening 28 with an incidence angle being in the angle range 43 in which the openings 28 and the pixels 29 have one-to-one correspondence with each other is incident to each pixel 29. On the other hand, infrared light which is tilted to exceed the angle range 43 is not incident to any pixel 29. Therefore, according to the proximity-type imaging device 11, even if the subject 12 is provided closely to the image sensor 13 to be in substantially close contact with each other, the subject 12 can be finely captured.

Here, description has been given on the premise that only infrared light having wavelengths near $\lambda_0$ originated from the LEDs 16 are incident to the proximity-type imaging device 11. However, when the imaging process is performed in a state where the surroundings of the subject 12 are not sufficiently light-shielded, there may be cases where infrared light having wavelengths longer than $\lambda_0$, which are originated from the surrounding environments of the subject 12, are incident to the proximity-type imaging device 11. Even in such cases, in the same manner described above, infrared light having relatively long wavelengths and being incident in a tilted state are decreased in their intensity by the low pass filter 17 as a whole and do not reach the angle limiting filter 18. Also, even if there is infrared light which has relatively long wavelengths, passes through the low pass filter 17 in a tilted state due to the transmittance characteristics for wavelengths longer than $\lambda_0$, and are incident to the openings 28, such infrared light is shielded by the angle limiting filter 18 as described above and do not reach the pixels 29. Accordingly, by configuring the proximity-type imaging device 11 so as to satisfy the above-described conditional expression (2) (conditional expression (1)), even in the case where the surroundings of the subject 12 are not sufficiently light-shielded, the subject 12 can be finely captured.

Also, in the above-described embodiment, description has been given on the example in which the openings 28 and the pixels 29 are arranged in the square grid, and each of the openings 28 and the pixels 29 is formed in the square shape. However, the shape of each of the openings 28 or the pixels 29 may not be a square.

Figure 6A:
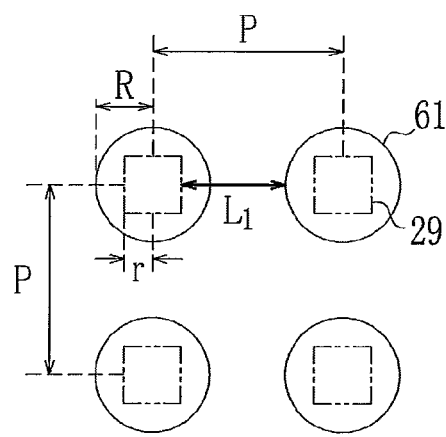
FIGS. 6A and 6B are explanatory diagrams showing modified examples of shapes of openings and pixels.

For example, as shown in FIG. 6A, the openings of the angle limiting filter 18 are formed as circle-shaped openings 61, and the pixels of the image sensor 13 are formed as square pixels 29. In this case, a shortest distance between the contour of a certain opening 61 and the contour of a pixel 29 corresponding to a neighbor opening 61 in the in-plane direction is $L_1$, which is the same as in the above-described embodiment. Accordingly, in order to satisfy the above-described conditional expression (2) (conditional expression (1)) in the case where the pixels 29 are formed in the square shape and the openings of the angle limiting filter 18 are formed as the circle-shaped openings 61, the angle limiting filter 18 and the image sensor 13 are configured so as to satisfy the conditional expression (3).

Figure 6B:
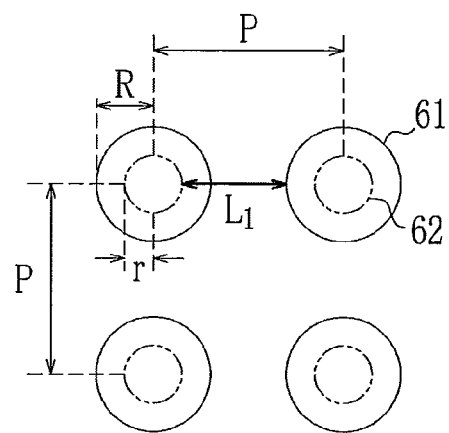

Also, for example, as shown in FIG. 6B, the openings of the angle limiting filter 18 are formed as circle-shaped openings 61, and the pixels of the image sensor 13 are formed as circle-shaped pixels 62. In this case, a distance between the contour of a certain opening 61 and the contour of a pixel 29 corresponding to a neighbor opening 61 is $L_1$, which is the same as in the above-described embodiment. Accordingly, in order to satisfy the above-described conditional expression (2) (conditional expression (1)) in the case where the openings of the angle limiting filter 18 and the pixels of the image sensor 13 are both formed in the circle shape, the angle limiting filter 18 and the image sensor 13 are configured so as to satisfy the conditional expression (3).

Also, in the above-described embodiment, description has been given on the example in which the openings 28 and the pixels 29 are arranged in the square grid, and each of the openings 28 and the pixels 29 is formed in the square shape. However, the arrangements of the openings 28 and the pixels 29 may not be formed in the square grid.

Figure 7C:
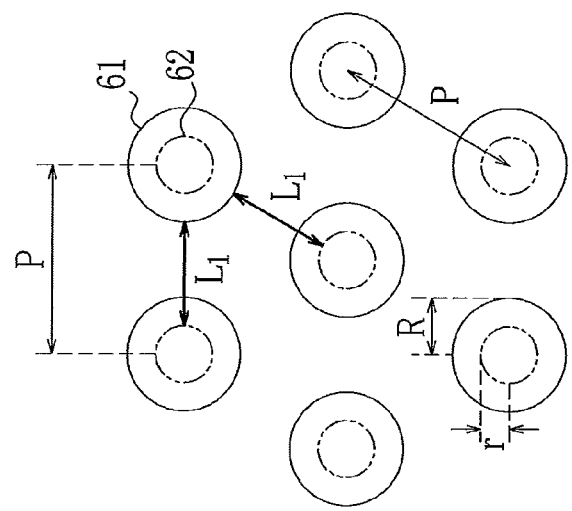
FIGS. 7A to 7C are explanatory diagrams showing modified examples of arrangement and shapes of the openings and the pixels.
Figure 7B:
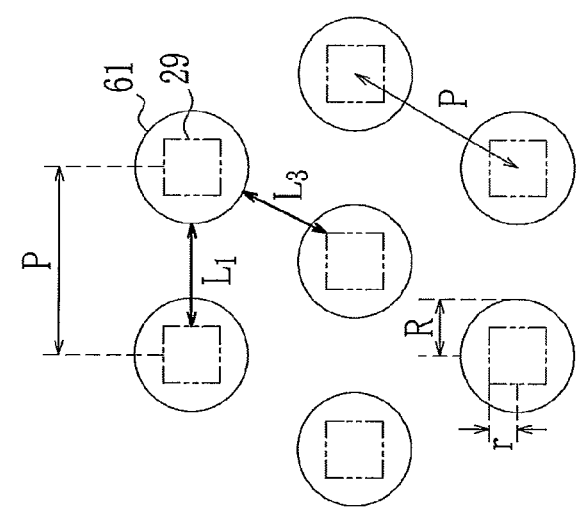
Figure 7A:
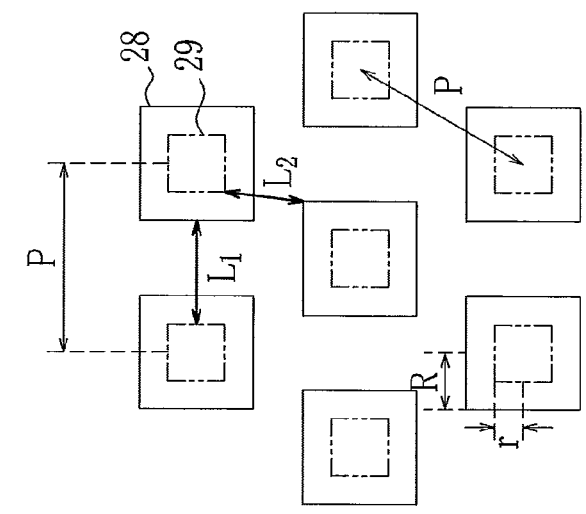

For example, as shown in FIG. 7A, the arrangement of the pixels 29 (and the openings 28) is a so-called honeycomb-shaped arrangement in which positions of the pixels 29 are shifted every row (or every column) and the pixels 29 are located at the vertexes of the regular triangles. In this case, on the periphery of each pixel 29, six other pixels 29 are adjacently located.

Accordingly, a distance $L_2$ that connects the vertex of an opening 28 and the vertex of a pixel 29 located in an adjacent row becomes the shortest distance between the contour of the opening 28 and the contour of a pixel 29 corresponding to a neighbor opening 28 in the in-plane direction. This shortest distance $L_2$ is different from a distance $L_1$ that is measured between the opening 28 and the pixel 29 which are adjacent to each other along the row as in the above-described embodiment. Accordingly, when the pixels 29 and the openings 28 are arranged in the honeycomb shape, the angle limiting filter 18 and the image sensor 13 are configured so that the shortest distance $L_2$ satisfies the above-described conditional expression (2) (conditional expression (1)). In this case, the pitch P of the pixels 29 and the openings 28 is configured so as to satisfy the following conditional expression (4).

$$P \geq \frac{1}{2}(\sqrt{3}+1)\cdot(R+r) + \frac{1}{2}\sqrt{2(\sqrt{3}-2)\cdot(R+r)^2 + \frac{4T_1^2}{n_1^2-1}} \quad (4)$$

Also, even in the case where the pixels and the openings are arranged in the honeycomb shape as described above, the shape of each of the pixels and the openings may be formed in an arbitrary shape. For example, as shown in FIG. 7B, it is assumed that the pixels and the openings are arranged in the honeycomb shape, that the pixels 29 are formed in a square shape, and that the openings are formed as circle-shaped openings 61. In this case, a distance $L_3$ connecting the vertex of the pixel 29 and an opening 61 located in an adjacent row is the shortest distance between the contour of the opening 61 and the contour of a pixel 29 corresponding to the neighbor opening 61 in the in-plane direction. This shortest distance $L_3$ is different from the distance $L_1$ in the above-described embodiment. Accordingly, when the pixels 29 and the openings 61 are arranged in the honeycomb shape, the angle limiting filter 18 and the image sensor 13 are configured such that the shortest distance $L_3$ satisfies the above-described conditional expression (1) (conditional expression (2)). In this case, the pitch P of the pixels 29 and the openings 61 is configured so as to satisfy the conditional expression (5) represented below.

$$P \geq \frac{1}{2}(\sqrt{3}+1) \cdot r + \frac{1}{2}\sqrt{2(\sqrt{3}-2) \cdot r^2 + 4\left(\frac{T_1}{\sqrt{n_1^2-1}}+R\right)^2} \quad (5)$$

For example, as shown in FIG. 7C, it is assumed that the pixels and the openings are arranged in the honeycomb shape, that the openings are formed as circle-shaped openings 61, and that the pixels are formed as circle-shaped pixels 62. In this case, a distance between the contour of the opening 61 and the contour of a pixel 62 corresponding to a neighbor opening 61 in the in-plane direction is $L_1$, which is the same as in the above-described embodiment. Accordingly, when the pixels and the opening are arranged in the honeycomb shape, and the pixel and the opening are formed in the circle shape, the angle limiting filter 18 and the image sensor 13 are configured so as to satisfy the above-described conditional expression (1). In this case, the pitch P of the openings 61 and the pixels 62 is configured so as to satisfy the above-described conditional expression (3).

Also, in the above-described embodiment, description has been given on the case where the thickness $T_2$ of the intermediate layer 31 interposed between the angle limiting filter 18 and the image sensor 13 is sufficiently smaller than the thickness $T_1$ of the glass substrate 26 of the angle limiting filter 18. However, in the case where the glass substrate 26 is extremely thin or the intermediate layer 31 is relatively thick, the following configuration may be used.

Figure 8:
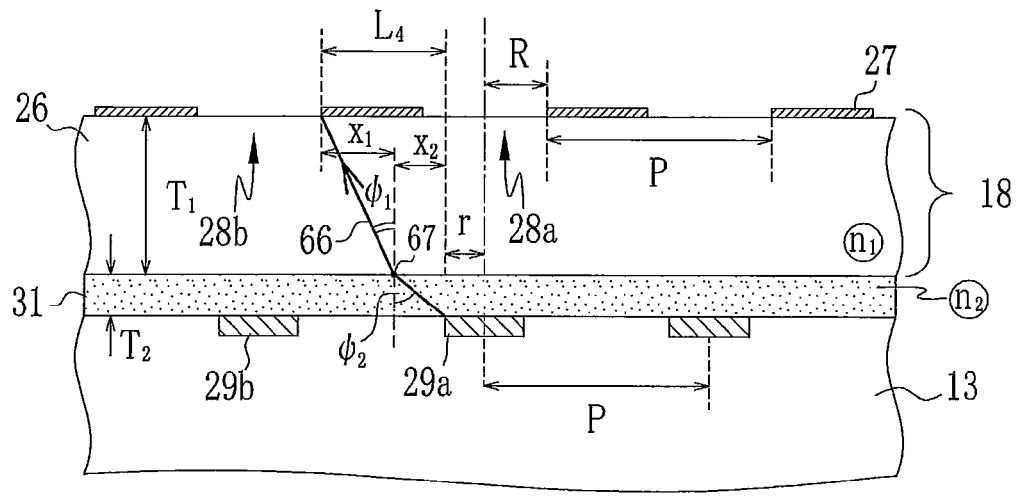
FIG. 8 is an explanatory diagram showing the configuration of the angle limiting filter for the case where a thickness of a intermediate layer cannot be ignored.

Firstly, as in the above-described embodiment, the case where the openings 28 and the pixels 29 are arranged in the square grid, and each of the openings 28 and the pixels 29 is formed in the square shape will be described. In this case, as shown in FIG. 8, when it is attempted that light is incident to a position of a contour of a neighbor opening 28b which is closest to a contour of a certain pixel 29a, refraction of a nonnegligible (substantial) degree occurs on a boundary between the intermediate layers 31 and the angle limiting filter 18. Accordingly, the shortest distance and the pitch P is to be set in consideration of refraction occurring on a boundary face between the intermediate layer 31 and the angle limiting filter 18.

Here, it is assumed that a refraction point 67 indicates a point in which light 66 emitted from the contour of the certain pixel 29a and being incident to the closest position of the contour of the neighbor opening 28b is refracted on a boundary between the intermediate layer 31 and the angle limiting filter 18, that $X_1$ denotes a distance from the refraction point 67 to the contour of the opening 28b in the in-plane direction, that $X_2$ denotes a distance from the refraction point 67 to the contour of the certain pixel 29a in the in-plane direction, and $L_4$ denotes a shortest distance from the contour of the opening 28b to the contour of the certain pixel 29a in the in-plane direction. In this case, in order for the light 66 to be totally reflected by the contour of the opening 28b, the shortest distance $L_4$ is set so as to satisfy the following conditional expression (6).

$$L_4 \geq X_1 + X_2 \quad (6)$$

When the refraction angle of the light 66 is denoted by $\psi_1$, the distance $X_1$ can be represented by "$X_1 = T_1 \tan \psi_1$". In order for light emitted from the pixel 29a toward the neighbor opening 28b to be totally reflected by the opening 28b, the refraction angle $\psi_1$ be equal to or greater than the critical angle $\theta_m$ ($\psi_1 \geq \theta_m$). Accordingly, the distance $X_1$ satisfies the following conditional expression (7). Also, the critical angle $\theta_m$ satisfies the condition of "$\sin \theta_m = 1/n_1$". Thus, when the conditional expression (7) is transformed by using this condition, the conditional expression to be satisfied by the distance $X_1$ is the following conditional expression (8).

$$X_1 \geq T_1 \cdot \tan \theta_m \quad (7)$$

$$X_1 \geq \frac{T_1}{\sqrt{n_1^2-1}} \quad (8)$$

Also, when the incidence angle of the light 66 from the intermediate layer 31 to the angle limiting filter 18 is denoted by $\psi_2$, the distance $X_2$ can be acquired by using "$X_2 = T_2 \tan \psi_2$". The refraction angle $\psi_1$ and the incidence angle $\psi_2$ have a relation of "$n_1 \sin \psi_1 = n_2 \sin \psi_2$". When these expressions are transformed by using the condition ($\sin \psi_1 = \sin \theta_m = 1/n_1$) for total reflection of the light 66 by the top surface of the angle limiting filter 18, the distance $X_2$ can be represented as in the following expression (9).

$$X_2 = \frac{T_2}{\sqrt{n_2^2-1}} \quad (9)$$

From these, the conditional expression (6) to be satisfied by the shortest distance $L_4$ can be represented as in the following expression (10). In the case where the thickness $T_2$ of the intermediate layer 31 cannot be ignored in view of comparison with the thickness $T_1$ of the glass substrate 26, in order to capture the subject 12 finely by using the proximity-type imaging device 11, the shortest distance $L_4$ between the contour of the opening 28 and the contour of the pixel 29 corresponding to the adjacent opening 28 in the in-plane direction satisfies the following condition expression (10).

$$L_4 \geq \frac{T_1}{\sqrt{n_1^2-1}} + \frac{T_2}{\sqrt{n_2^2-1}} \quad (10)$$

Also, when the intermediate layer 31 has a thickness $T_2$ that cannot be ignored in view of comparison with the thickness $T_1$ of the glass substrate 26, the openings 28 and the pixels 29 are arranged in the square grid, and each of the openings 28 and the pixels 29 is formed in the square shape, the angle limiting filter 18 and the image sensor 13 are preferably configured so that the pitch P of the openings 28 and the pixels 29 satisfies the following conditional expression (11).

$$P \geq \frac{T_1}{\sqrt{n_1^2-1}} + \frac{T_2}{\sqrt{n_2^2-1}} + (R+r) \quad (11)$$

Also, even when the intermediate layer 31 has the thickness $T_2$ that cannot be ignored in view of comparison with the thickness $T_1$ of the glass substrate 26, the openings and pixels that are the same as those shown in FIG. 6A are arranged in the square grid, the opening is formed as the circle-shaped openings 61, and the pixels are formed as the square-shaped pixels 29, the angle limiting filter 18 and the image sensor 13 are preferably configured so as to satisfy the above-described conditional expression (11).

Also, even when the intermediate layer 31 has the thickness $T_2$ that cannot be ignored in view of comparison with the thickness $T_1$ of the glass substrate 26, the openings and pixels are arranged in the square grid as in FIG. 6B, the openings are formed as the circle-shaped openings 61, and the pixels are formed as the circle-shaped pixels 62, the angle limiting filter 18 and the image sensor 13 are preferably configured such that the pitch P of the openings 61 and the pixels 62 satisfies the above-described conditional expression (11).

Also, when the intermediate layer 31 has the thickness $T_2$ that cannot be ignored in view of comparison with the thickness $T_1$ of the glass substrate 26, the openings 28 and the pixels 29 are arranged in the honeycomb shape as in FIG. 7A, and each of the openings 28 and the pixels 29 is formed in the square shape, the angle limiting filter 18 and the image sensor 13 are preferably configured so that the pitch P of the openings 28 and the pixels 29 satisfies the following conditional expression (12).

$$P \geq \frac{1}{2}(\sqrt{3}+1) \cdot (R+r) + \frac{1}{2}\sqrt{2(\sqrt{3}-2) \cdot (R+r)^2 + \frac{4\left(T_1\sqrt{n_2^2-1}+T_2\sqrt{n_1^2-1}\right)^2}{(n_1^2-1) \cdot (n_2^2-1)}} \quad (12)$$

Similarly, when the intermediate layer 31 has the thickness $T_2$ that cannot be ignored in view of comparison with the thickness $T_1$ of the glass substrate 26, the openings and the pixels are arranged in the honeycomb shape as in FIG. 7B, the openings are formed as the circular openings 61, and the pixels are formed as the square-shaped pixels 29, the angle limiting filter 18 and the image sensor 13 are preferably configured so that the pitch P of the openings 28 and the pixels 29 satisfies the following conditional expression (13).

$$P \geq \frac{1}{2}(\sqrt{3}+1) \cdot r + \frac{1}{2}\sqrt{2(\sqrt{3}-2) \cdot r^2 + 4\left(\frac{T_1}{\sqrt{n_1^2-1}}+\frac{T_2}{\sqrt{n_2^2-1}}+R\right)^2} \quad (13)$$

Also, when the intermediate layer 31 has the thickness $T_2$ that cannot be ignored in view of comparison with the thickness $T_1$ of the glass substrate 26, the openings and the pixels are arranged in the honeycomb shape as in FIG. 7C, the openings are formed as the circular openings 61, and the pixels are formed as the circle-shaped pixels 62, the angle limiting filter 18 and the image sensor 13 are preferably configured so that the pitch P of the openings 28 and the pixels 29 satisfies the above-described conditional expression (11).

Also, as can be seen from a method of deriving the conditional expression (10), when plural materials having thicknesses that cannot be ignored in view of comparison with the thickness T of the glass substrate 26 are interposed between the angle limiting filter 18 and the image sensor 13, a shortest distance L between the contour of the opening 28 and the contour of the pixel 29 corresponding to an adjacent opening 28 in the in-plane direction satisfies the following conditional expression (14):

$$L \geq \sum_k \frac{T_k}{\sqrt{n_k^2-1}} \quad (14)$$

where $T_k$ denotes a thickness of each of the materials which are located between the front side of the image sensor 13 and the angle limiting filter 18 and which include the glass substrate 26, and $n_k$ denotes the refractive index of each material.

Also, in the above-described embodiments and the modified examples, description has been given on the examples where the top surface (the subject 12 side) of the angle limiting filter 18 is in contact with air. However, the top surface of the angle limiting filter 18 may be in contact with an adhesive agent or the like. For example, when the top surface of the angle limiting filter 18 is in contact with a material having a refractive index $n_0$, the conditional expressions to be satisfied by the shortest distance between the contour of an opening and the contour of a pixel corresponding to an adjacent opening in the in-plane direction and the conditional expressions to be satisfied by the pitch P of the openings and the pixels can be acquired by substituting the refractive index $n_1$ ($n_2$, $n_k$) of the above-described conditional expressions 1 to 14 by relative refractive index $n_1/n_0$ ($n_2/n_0$, $n_k/n_0$) that is a refractive index relative to the refractive index $n_0$.

Also, in the above-described embodiment and the modified examples thereof, for convenience of description, description has been given on the examples in which the low pass filter 17, the angle limiting filter 18, and the image sensor 13 are arranged in this order from the subject 12 side. However, regarding the arrangement order of the low pass filter 17 and the angle limiting filter 18, the angle limiting filter 18, the low pass filter 17, and the image sensor 13 are preferably arranged in this order from the subject 12 side, that is, in the order opposite to those of the above-described embodiment and the modified examples thereof. In particular, in the case where optical components such as micro lenses, which are disposed in correspondence with the pixels, are additionally disposed in the subject 12 rather than the low pass filter 17 and the angle limiting filter 18, when the angle limiting filter 18, the low pass filter 17, and the image sensor 13 are arranged in this order from the subject 12 side, noise light is further reduced, whereby fine imaging can be performed in an easy manner.

Figure 9:
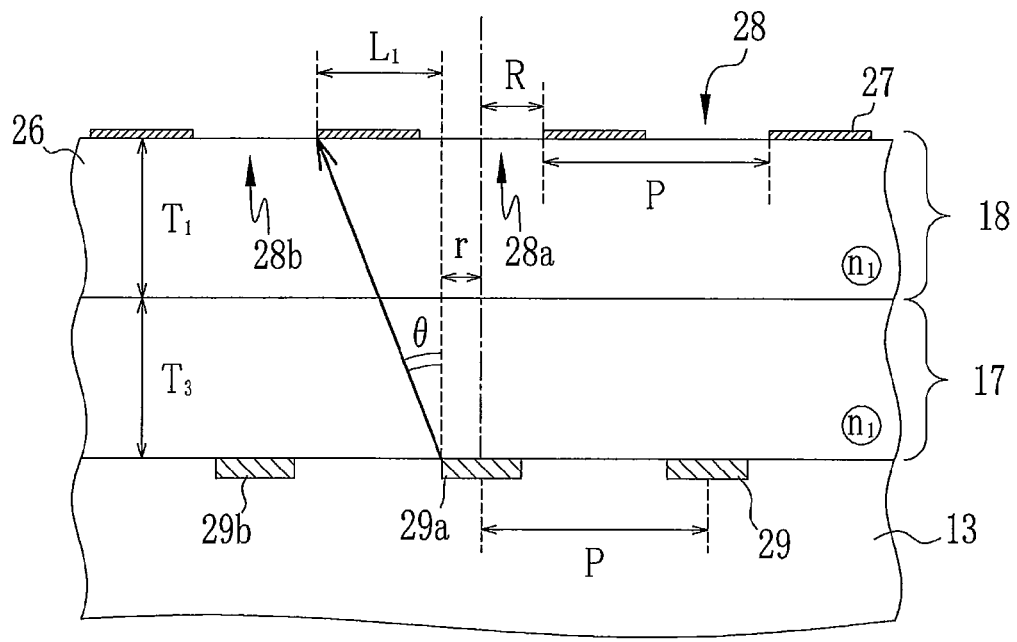
FIG. 9 is an explanatory diagram showing an example in which a low pass filter is provided between the angle limiting filter and an image sensor.

Accordingly, when the angle limiting filter 18 and the low pass filter 17 are arranged in this order from the subject 12 side, the thickness, the refractive index, and the like of the glass substrate of the low pass filter 17 need to be considered. Therefore, the conditional expression to be satisfied by the shortest distance L becomes different on its appearance. However, the conditional expression is substantially the same as those of the above-described embodiments and the modified examples thereof. For example, as shown in FIG. 9, the low pass filter 17 is interposed between the angle limiting filter 18 and the image sensor 13, and the thickness of the glass substrate of the low pass filter 17 is assumed to be $T_3$. Also, the refractive index of the glass substrate of the low pass filter 17 is assumed to be the refractive index $n_1$ that is the same as that of the glass substrate 26 of the angle limiting filter 18. Also, the thickness of a portion of a stacking body of the dielectric thin film that exhibits the function of the low pass filter 17 and the thickness of a layer of an adhesive agent or air that is interposed between the angle limiting filter 18 and the low pass filter 17 are assumed to be sufficiently small, as compared with a sum of the thicknesses of the glass substrate 26 of the angle limiting filter 18 and the glass substrate of the low pass filter 17, so that refraction in the layers can be ignored. In this case, the sum ($T_1+T_3$) of the thicknesses of the glass substrate 26 of the angle limiting filter 18 and the glass substrate of the low pass filter 17 can be regarded as the thickness of the angle limiting filter 18. Thus, the conditional expression to be satisfied by the shortest distance L can be acquired by substituting $T_1$ by "$T_1+T_3$" in the conditional expressions (1) and (2). Accordingly, the conditional expression to be satisfied by the pitches P of the openings and the pixels can be acquired by substituting $T_1$ by "T1+$T_3$" in the above-described conditional expressions (3) to (5) in accordance with a combination of the arrangements and the shapes of the openings and the pixels.

Also, it is assumed that although a thickness of the stacking body of the dielectric body thin film and a thickness of a layer of the adhesive agent, air, or the like that is interposed between the angle limiting filter 18 and the low pass filter 17 are sufficiently small, the refractive index of the glass substrate of the low pass filter 17 is a refractive index $n_3$ that is different from the refractive index $n_1$ of the glass substrate of the angle limiting filter 18. In this case, as in the above-described modified example (see FIG. 8), the glass substrate of the low pass filter 17 can be regarded as the intermediate layer 31 having a substantial thickness. Accordingly, the conditional expression to be satisfied by the shortest distance L can be acquired by substituting $T_2$ by $T_3$ and substituting $n_2$ by $n_3$ in the above-described conditional expression (10). Therefore, the conditional expression to be satisfied by the pitch P of the openings and the pixels can be acquired by substituting $T_2$ by $T_3$ and substituting $n_2$ by $n_3$ in the conditional expressions (11) to (13).

Also, it is assumed that the low pass filter 17 is interposed between the angle limiting filter 18 and the image sensor 13, the refractive index of the glass substrate of the low pass filter 17 is a refractive index $n_3$ that is different from the refractive index $n_1$ of the glass substrate of the angle limiting filter 18, and the thickness of the stacking body of the dielectric thin film and the thickness of the layer of an adhesive agent, air, or the like that is interposed between the angle limiting filter 18 and the low pass filter 17 cannot be ignored. In this case, the conditional expression for the shortest distance L can be determined based on the above-described conditional expression (14) in consideration of the thicknesses and the refractive indices of all the layers that cannot be ignored. Also, the conditional expression to be satisfied by the pitch P of the openings and the pixels can be determined in accordance with a combination of the arrangements and the shapes of the openings and the pixels, similarly to the above-described embodiment and the modified examples thereof.

As can be seen from the above-described embodiments and the modified examples thereof, the lower limit of the shortest distance L has a minimum value when the angle limiting filter 18 and the image sensor 13 are in close contact with each other. Accordingly, a noise caused by the tilted incident light can be reduced by configuring the proximity-type imaging device 11 so as to satisfy at least the conditional expression (2) (conditional expression (1)) irrespective of (i) the relative arrangement order of the low pass filter 17 and the angle limiting filter 18 and (ii) whether or not an optical component (micro lens or the like) other than the low pass filter 17 and the angle limiting filter 18 are provided. Also, as in the above-described embodiment and the modified examples thereof, the noise can be reduced sufficiently by configuring the proximity-type imaging device 11 so as to satisfy the conditional expressions (3) to (14) in accordance with various practical conditions such as (i) the arrangements and the shapes of the openings and the pixels, (ii) the relative arrangement order of the low pass filter 17 and the angle limiting filter 18, (iii) whether or not an optical component such as a micro lens is provided, and (iv) the thickness and the refractive index of the intermediate layer 31.

Also, in the above-described embodiment and the modified examples thereof, description has been given on the examples in which the openings and the pixels are arranged in the square grid or the honeycomb shape. However, the arrangement of the openings and the pixels is not limited thereto, and any arbitrary arrangement may be used. Also, in the above-described embodiment and the modified examples thereof, description has been given on the example in which the openings or the pixels are formed in the square shape or the circle shape. However, the shape of the opening or the pixel is not limited thereto and may be formed in any arbitrary shape such as a rectangle or a regular hexagon. Also, in the above-described embodiment and the modified examples thereof, as a combination of the shapes of the opening and the pixel, description has been given on three examples including the example in which both the openings and the pixels are formed in the square shape, the example in which the openings are formed in the circular shape and the pixels are formed in the square shape, and the example in which both the openings and the pixels are formed in the circle shape. However, the combination of the shapes of the opening and the pixel is not limited thereto. For example, it may be configured that the openings are formed in a square shape and the pixels are formed in a circle shape, and arbitrary shapes such as a rectangle and a regular hexagon, as described above, may be combined. As described above, even in the case where the arrangements of the openings and the pixels or the shape of the opening or the pixel are set to be different from those of the above-described embodiment and the modified examples thereof, the conditional expression to be satisfied by the shortest distance L between the contour of an opening and the contour of a pixel corresponding to an adjacent opening or the conditional expression to be satisfied by the pitch P of the openings and the pixels can be acquired in a similar manner described in the above-described embodiment and the modified examples thereof.

Also, in the above-described embodiment and the modified examples thereof, description has been given on the example in which the low pass filter 17 and the high pass filter (not shown) are separately disposed. However, instead of these filters, a band pass filter having both the characteristics of those filters may be used. Also, in the above-described embodiment and the modified examples thereof, description has been given on the example in which the low pass filter 17 and the angle limiting filter 18 are separately disposed. However, the low pass filter 17 and the angle limiting filter 18 may be integrally formed by arranging a stacking body of a dielectric thin film that serves as the low pass filter 17 on one of (or on both) the front or rear faces of the angle limiting filter 18. Similarly, the high pass filter may be integrally formed with the angle limiting filter 18. Also, in the case where a cover glass is disposed in the image sensor 13, various filters may be integrally formed therein. As described above, by integrally forming the high pass filter, the low pass filter 17, the angle limiting filter 18, and the like, the number of components is reduced. Accordingly, a proximity-type imaging device can be manufactured at low cost, and the proximity-type imaging device can be formed to be thinner.

Also, in the above-described embodiment and the modified examples thereof, description has been given on the example in which the subject 12 is captured with infrared light having the wavelength of $\lambda_0$ has been described. However, the invention is not limited thereto. The subject 12 may be captured with light having an arbitrary wavelength range such as infrared light being in a different wavelength range, visible light, or ultraviolet rays.

What is claimed is:

1. A proximity-type imaging device comprising:
an image sensor that performs photoelectric conversion for light transmitted from a subject that is in proximity thereto using a plurality of pixels arranged in a predetermined arrangement, so as to capture the subject; and
an imaging filter that includes
a transparent substrate, and
a light shielding film which is formed with openings having one-to-one correspondence with the pixels and which is provided on a subject side of the substrate,
the imaging filter that is disposed on a front side of the image sensor and that limits an incidence angle of light incident to the image sensor to such an angle range that the light is incident from each opening to the pixel corresponding to each opening, wherein
the following condition is satisfied $$L \geq \frac{T_1}{\sqrt{n_1^2 - 1}}$$

where
$n_1$ denotes a refractive index of the substrate,
$T_1$ denotes a thickness of the substrate, and
L denotes a shortest distance between a contour of one opening and a contour of the pixel corresponding to an opening adjacent to the one opening in an in-plane direction.

2. The proximity-type imaging device according to claim 1, further comprising:
a wavelength limiting filter that limits a wavelength of light, which is transmitted to an image sensor side, to a predetermined wavelength range and that decreases in transmittance of the light being in the predetermined wavelength range as the incidence angle of the light increases.

3. The proximity-type imaging device according to claim 1, further comprising:
an intermediate layer that has a thickness of $T_2$ and a refractive index of $n_2$ and that is disposed between the imaging filter and the image sensor, wherein
the shortest distance L satisfies the following condition $$L \geq \frac{T_1}{\sqrt{n_1^2 - 1}} + \frac{T_2}{\sqrt{n_2^2 - 1}}.$$

4. The proximity-type imaging device according to claim 2, further comprising:
an intermediate layer that has a thickness of $T_2$ and a refractive index of $n_2$ and that is disposed between the imaging filter and the image sensor, wherein
the shortest distance L satisfies the following condition $$L \geq \frac{T_1}{\sqrt{n_1^2 - 1}} + \frac{T_2}{\sqrt{n_2^2 - 1}}.$$

5. The proximity-type imaging device according to claim 1, wherein
the openings and the pixels are arranged in a square grid,
the openings and the pixels are formed in a square shape, and
the following condition is satisfied:

$$P \geq \frac{T_1}{\sqrt{n_1^2 - 1}} + (R + r)$$

where
R denotes a shortest distance from a center of each opening to the contour of each opening,
r denotes a shortest distance from a center of each pixel to the contour of each pixel, and
P denotes a pitch of the arrangement of the openings and the pixels.

6. The proximity-type imaging device according to claim 2, wherein
the openings and the pixels are arranged in a square grid,
the openings and the pixels are formed in a square shape, and
the following condition is satisfied:

$$P \geq \frac{T_1}{\sqrt{n_1^2 - 1}} + (R + r)$$

where
R denotes a shortest distance from a center of each opening to the contour of each opening,
r denotes a shortest distance from a center of each pixel to the contour of each pixel, and
P denotes a pitch of the arrangement of the openings and the pixels.

7. The proximity-type imaging device according to claim 1, wherein
the openings and the pixels are arranged in a square grid,
the openings are formed in a circle shape,
the pixels are formed in a square shape, and
the following condition is satisfied:

$$P \geq \frac{T_1}{\sqrt{n_1^2 - 1}} + (R + r)$$

where
R denotes a shortest distance from a center of each opening to the contour of each opening,
r denotes a shortest distance from a center of each pixel to the contour of each pixel, and
P denotes a pitch of the arrangement of the openings and the pixels.

8. The proximity-type imaging device according to claim 2, wherein
the openings and the pixels are arranged in a square grid,
the openings are formed in a circle shape,
the pixels are formed in a square shape, and
the following condition is satisfied:

$$P \geq \frac{T_1}{\sqrt{n_1^2 - 1}} + (R + r)$$

where
- R denotes a shortest distance from a center of each opening to the contour of each opening,
- r denotes a shortest distance from a center of each pixel to the contour of each pixel, and
- P denotes a pitch of the arrangement of the openings and the pixels.

9. The proximity-type imaging device according to claim 1, wherein
the openings and the pixels are arranged in a square grid,
the openings and the pixels are formed in a circle shape, and
the following condition is satisfied:

$$P \geq \frac{T_1}{\sqrt{n_1^2 - 1}} + (R + r)$$

where
- R denotes a shortest distance from a center of each opening to the contour of each opening,
- r denotes a shortest distance from a center of each pixel to the contour of each pixel, and
- P denotes a pitch of the arrangement of the openings and the pixels.

10. The proximity-type imaging device according to claim 2, wherein
the openings and the pixels are arranged in a square grid,
the openings and the pixels are formed in a circle shape, and
the following condition is satisfied:

$$P \geq \frac{T_1}{\sqrt{n_1^2 - 1}} + (R + r)$$

where
- R denotes a shortest distance from a center of each opening to the contour of each opening,
- r denotes a shortest distance from a center of each pixel to the contour of each pixel, and
- P denotes a pitch of the arrangement of the openings and the pixels.

11. The proximity-type imaging device according to claim 1, wherein
the openings and the pixels are arranged in a honeycomb shape in which positions of the openings and the pixels are alternately shifted every row or every column so that the openings and the pixels are located at vertexes of regular triangles,
the openings and the pixels are formed in a square shape, and
the following condition is satisfied:

$$P \geq \frac{1}{2}(\sqrt{3} + 1)\cdot(R + r) + \frac{1}{2}\sqrt{2(\sqrt{3} - 2)\cdot(R + r)^2 + \frac{4T_1^2}{n_1^2 - 1}}$$

where
- R denotes a shortest distance from a center of each opening to the contour of each opening,
- r denotes a shortest distance from a center of each pixel to the contour of each pixel, and
- P denotes a pitch of the arrangement of the openings and the pixels.

12. The proximity-type imaging device according to claim 2, wherein
the openings and the pixels are arranged in a honeycomb shape in which positions of the openings and the pixels are alternately shifted every row or every column so that the openings and the pixels are located at vertexes of regular triangles,
the openings and the pixels are formed in a square shape, and
the following condition is satisfied:

$$P \geq \frac{1}{2}(\sqrt{3} + 1)\cdot(R + r) + \frac{1}{2}\sqrt{2(\sqrt{3} - 2)\cdot(R + r)^2 + \frac{4T_1^2}{n_1^2 - 1}}$$

where
- R denotes a shortest distance from a center of each opening to the contour of each opening,
- r denotes a shortest distance from a center of each pixel to the contour of each pixel, and
- P denotes a pitch of the arrangement of the openings and the pixels.

13. The proximity-type imaging device according to claim 1, wherein
the openings and the pixels are arranged in a honeycomb shape in which positions of the openings and the pixels are alternately shifted every row or every column so that the openings and the pixels are located at vertexes of regular triangles,
the openings are formed in a circle shape,
the pixels are formed in a square shape, and
the following condition is satisfied:

$$P \geq \frac{1}{2}(\sqrt{3} + 1)\cdot r + \frac{1}{2}\sqrt{2(\sqrt{3} - 2)\cdot r^2 + 4\left(\frac{T_1}{\sqrt{n_1^2 - 1}} + R\right)^2}$$

where
- R denotes a shortest distance from a center of each opening to the contour of each opening,
- r denotes a shortest distance from a center of each pixel to the contour of each pixel, and
- P denotes a pitch of the arrangement of the openings and the pixels.

14. The proximity-type imaging device according to claim 2, wherein
the openings and the pixels are arranged in a honeycomb shape in which positions of the openings and the pixels are alternately shifted every row or every column so that the openings and the pixels are located at vertexes of regular triangles,
the openings are formed in a circle shape,
the pixels are formed in a square shape, and
the following condition is satisfied:

$$P \geq \frac{1}{2}(\sqrt{3}+1) \cdot r + \frac{1}{2}\sqrt{2(\sqrt{3}-2) \cdot r^2 + 4\left(\frac{T_1}{\sqrt{n_1^2-1}} + R\right)^2}$$

where
- R denotes a shortest distance from a center of each opening to the contour of each opening,
- r denotes a shortest distance from a center of each pixel to the contour of each pixel, and
- P denotes a pitch of the arrangement of the openings and the pixels.

15. The proximity-type imaging device according to claim 1, wherein
the openings and the pixels are arranged in a honeycomb shape in which positions of the openings and the pixels are alternately shifted every row or every column so that the openings and the pixels are located at vertexes of regular triangles,
the openings and the pixels are formed in a circle shape, and
the following condition is satisfied:

$$P \geq \frac{T_1}{\sqrt{n_1^2-1}} + (R+r)$$

where
- R denotes a shortest distance from a center of each opening to the contour of each opening,
- r denotes a shortest distance from a center of each pixel to the contour of each pixel, and
- P denotes a pitch of the arrangement of the openings and the pixels.

16. The proximity-type imaging device according to claim 2, wherein
the openings and the pixels are arranged in a honeycomb shape in which positions of the openings and the pixels are alternately shifted every row or every column so that the openings and the pixels are located at vertexes of regular triangles,
the openings and the pixels are formed in a circle shape, and
the following condition is satisfied:

$$P \geq \frac{T_1}{\sqrt{n_1^2-1}} + (R+r)$$

where
- R denotes a shortest distance from a center of each opening to the contour of each opening,
- r denotes a shortest distance from a center of each pixel to the contour of each pixel, and
- P denotes a pitch of the arrangement of the openings and the pixels.

17. An imaging filter that is disposed on a front side of an image sensor which performs photoelectric conversion for light transmitted from a subject that is in proximity thereto using a plurality of pixels arranged in a predetermined arrangement, so as to capture the subject, the imaging filter comprising:
a transparent substrate; and
a light shielding film that is formed with openings having one-to-one correspondence with the pixels and that is provided on a subject side of the substrate, wherein
the following condition is satisfied $$L \geq \frac{T_1}{\sqrt{n_1^2-1}}$$

where
- $n_1$ denotes a refractive index of the substrate,
- $T_1$ denotes a thickness of the substrate, and
- L denotes a shortest distance between a contour of one opening and a contour of the pixel corresponding to an opening adjacent to the one opening in an in-plane direction, and
- an incidence angle of light incident to the image sensor is limited to such an angle range that the light is incident from each opening to the pixel corresponding to each opening.

* * * * *